United States Patent
Peck et al.

(10) Patent No.: US 7,335,864 B2
(45) Date of Patent: Feb. 26, 2008

(54) MAGNETIC FIELD REDUCTION RESISTIVE HEATING ELEMENTS

(75) Inventors: Kevin B. Peck, Sonora, CA (US); Noel H. Johnson, Sonora, CA (US); Jim Sanches, Sonora, CA (US); Pontus K. H. Nilsson, Oakdale, CA (US)

(73) Assignee: MRL Industries, Inc., Sonora, CA (US)

( * ) Notice: Subject to any disclaimer, the term of this patent is extended or adjusted under 35 U.S.C. 154(b) by 0 days.

(21) Appl. No.: 11/443,439

(22) Filed: May 31, 2006

(65) Prior Publication Data

US 2007/0029305 A1  Feb. 8, 2007

Related U.S. Application Data

(60) Provisional application No. 60/685,881, filed on Jun. 1, 2005.

(51) Int. Cl.
*H05B 6/36* (2006.01)

(52) U.S. Cl. ............... 219/674; 335/216; 373/152; 373/153; 373/166

(58) Field of Classification Search ............... 219/674; 335/216; 373/152–3, 166
See application file for complete search history.

(56) References Cited

U.S. PATENT DOCUMENTS

| 5,038,019 A | 8/1991 | McEntire et al. |
| 5,461,214 A | 10/1995 | Peck et al. |
| 5,676,784 A * | 10/1997 | McGaffigan ............... 156/172 |
| 6,512,206 B1 | 1/2003 | McEntire et al. |

* cited by examiner

*Primary Examiner*—Shawntina Fuqua
(74) *Attorney, Agent, or Firm*—Drinker Biddle & Reath LLP

(57) ABSTRACT

Heating element assemblies, heating furnaces incorporating heating element assemblies, methods to form heating element assemblies, methods to form heating furnaces and methods to reduce a magnetic field in a bifilar coil are disclosed. The heating element assembly includes two components, each component formed from heating element wire. The two components are spatially positioned and electrically arranged, relative to each other, so that an electrical current applied to the heating element assembly simultaneously travels through the two components in opposite directions.

15 Claims, 3 Drawing Sheets

MAGNETIC FIELD REDUCTION RESISTIVE HEATING ELEMENTS

RELATED APPLICATION DATA

This application claims the benefit of priority under 35 U.S.C. §119(e) to U.S. Provisional Application No. 60/685,881, filed Jun. 1, 2005, the entire contents of which are incorporated herein by reference.

FIELD OF THE DISCLOSURE

The present disclosure relates to resistive heating elements. More specifically, the present disclosure is related to the construction and arrangement of resistive heating elements in an assembly to achieve beneficial performance.

STATE OF THE ART

In the discussion of the state of the art that follows, reference is made to certain structures and/or methods. However, the following references should not be construed as an admission that these structures and/or methods constitute prior art. Applicant expressly reserves the right to demonstrate that such structures and/or methods do not qualify as prior art against the present invention Resistive heating elements are commonly used in thermal processing. See, for example, U.S. Pat. Nos: 5,038,019; 5,461,214; and 6,512,206.

Many conventional higher temperature heating elements employ a cylindrical heating element assembly where the active heating element is a helical coil of resistance wire. This wire tends to have a relatively low resistance which necessitates fairly large currents to generate the power dissipation required to heat the wire to the desired operating temperatures.

It is commonly known that a wire conducting a current creates a magnetic field around it. Applying Ampere's Law to a straight conductor tells us the magnetic field is organized as a series of lines that circulate about the axis of the conductor in a direction dependent on the direction of current flow. Observing the conductor end with the current flowing towards you yields field lines rotating counter-clockwise. Furthermore, when this is applied to a helical coil of wire, the field becomes organized into a north-south orientation with the north pole oriented at the end of the coil from which the current is exiting.

On the outside of the coil, the strength of the magnetic field diminishes as the radial distance from the conductor increases. At any given distance from the conductor, the strength of the magnetic field increases directly with the amount of current in the conductor. The magnetic field outside a helical coil resembles the field formed outside a bar magnet. Inside the helical coil, the magnetic field resembles a solenoid where the internal magnetic field consists of straight, uniformly spaced lines of flux.

A fluctuating magnetic field within the heating element can cause undesirable effects.

One such effect is magnetostriction. Magnetostriction is the result of a material being exposed to a fluctuating magnetic field. This causes fractional changes in dimensions of the material as the material is exposed to the fluctuating magnetic field. Many materials have documented magnetostictive properties that can cause them to vibrate when placed in a fluctuating magnetic field. Magnetostriction is the cause of hum in power transformers.

When used in a cylindrical heating element assembly where the active heating element is a helical coil of resistance wire, the vibration induced by magnetostriction can cause various problems with the materials being processed within the heating element. One such problem is the displacement of parts that are being processed within the furnace, e.g., due to vibration.

The internal field can also have undesirable effects on sensors placed within the furnace cavity to measure process parameters.

The fluctuating magnetic field may have other undesirable effects on the process as well.

The field external to the heating element assembly may have undesirable effects on instrumentation in the proximity of the element assembly.

SUMMARY

An exemplary heating element assembly comprises two components, each component formed from heating element wire, wherein the two components are spatially dispersed over the same axis and positioned relative to each other so that an electrical current applied to the heating element simultaneously travels through the two components in opposite directions.

The two components can be any suitable shape to result in the applied electrical current traveling through the two components in opposite directions.

An exemplary method to reduce a magnetic field in a bifilar coil comprises electrically connecting the bifilar coil to place a direction of current flow in a first section of the coil and a second section of the coil in opposition, the first section and the second section sequentially adjacent in an axial direction of the bifilar coil.

An exemplary method of forming a heating element assembly comprises constructing a bifilar helical coil by intertwining two helical components, each helical component formed from heating element wire, wherein the two helical components are spatially positioned and electrically arranged, relative to each other, so that an electrical current applied to the bifilar helical coil simultaneously travels through the two helical components in opposite directions.

An exemplary method of forming a heating furnace comprises constructing a bifilar helical coil by intertwining two helical components, each helical component formed from heating element wire, and attaching the bifilar helical coil to an electrical circuit of a heating furnace, wherein the two helical components are spatially positioned and electrically arranged, relative to each other, so that electrical current simultaneously travels through the two helical components in opposite directions.

BRIEF DESCRIPTION OF THE DRAWING FIGURES

The following detailed description of preferred embodiments can be read in connection with the accompanying drawings in which like numerals designate like elements and in which.

DETAILED DESCRIPTION

An exemplary heating element assembly comprises two components, each component formed from heating element wire. The two components are spatially positioned and electrically arranged, relative to each other, so that an electrical current applied to the heating element simultaneously travels through the two components in opposite directions.

The two components can be any suitable shape to result in the applied electrical current traveling through the two components in opposite directions. For example, the two components can be two helical components and the heating element is a bifilar helical coil. The two helical components are intertwined to result in the applied electrical current traveling through the two components in opposite directions, e.g., in a first direction in a first one of the two components and in a second direction in a second one of the two components. In another example, the two components have a non-helical shape. Certain specialty heating environments use non-helical geometric arrangements for heating elements. These non-helical geometric arrangements can be both regular geometric figures, e.g., circles, polygonal, and so forth, and irregular geometric figures including specialty configurations to meet an end-user defined heating profile.

In additional exemplary embodiments, any of the herein disclosed heating element assemblies can be included in a heating furnace, such as a heating furnace for heat treating substrates, a heating furnace for heat treating semiconductor materials and/or a heating furnace for heat treating metallic components.

It should be understood that the embodiments and methods disclosed herein apply to both DC and AC applications. Application of DC provides current traveling in opposite directions; application of AC, where the direction periodically reverses itself, also provides current traveling in opposite directions at a point in time.

Figure 1:
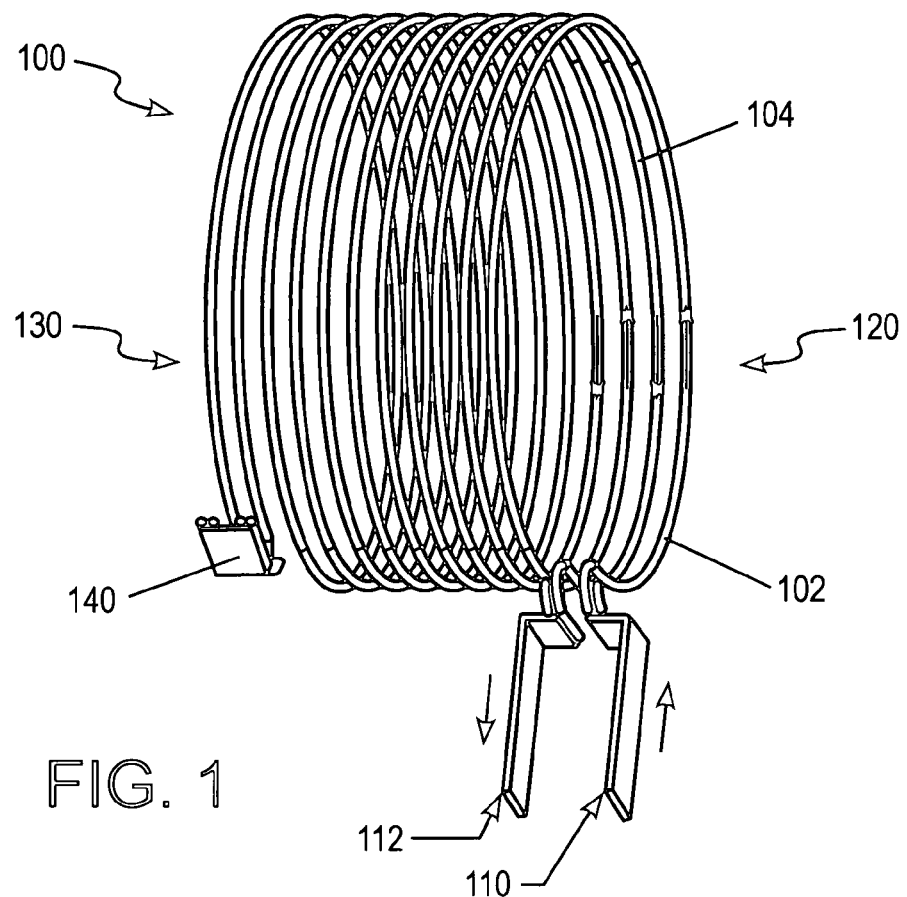
FIG. 1 shows an isometric view of a heating element assembly with a bifilar coil with opposing current flow paths.

FIG. 1 shows an exemplary embodiment of a heating element assembly 100. In FIG. 1, two helical coils 102, 104 are intertwined such that they share a common axis 106 defined by their center points and are evenly spaced so that the distance between corresponding loops in a first coil 102 and a second coil 104 are the same. The first coil 102 begins at a first connector 110 at the first end 120 of the assembly 100 and continues to the second end 130 of the assembly 100. The second coil 104 begins at a second connector 112 at the first end 120 and terminates at the second end 130. At the second end 130, the first coil 102 and the second coil 104 are electrically connected by connector 140. In an electrical circuit, the first connector 110 and the second connector 112 can be the start and end of an electrical circuit.

In the FIG. 1 exemplary embodiment, the opposing current flow paths in the bifilar coils are shown. At the first end 110, the individual components of the bifilar coil, e.g., the two unifilar sections, are electrically arranged such that an applied electrical current travels through the two components in opposite directions, indicated by the direction of the arrows, which indicate the instantaneous current flow. The shown bifilar coil is a single zone bifilar coil, but multiple zone bifilar coils and coils incorporating more than two sections can also be constructed.

Figure 2:
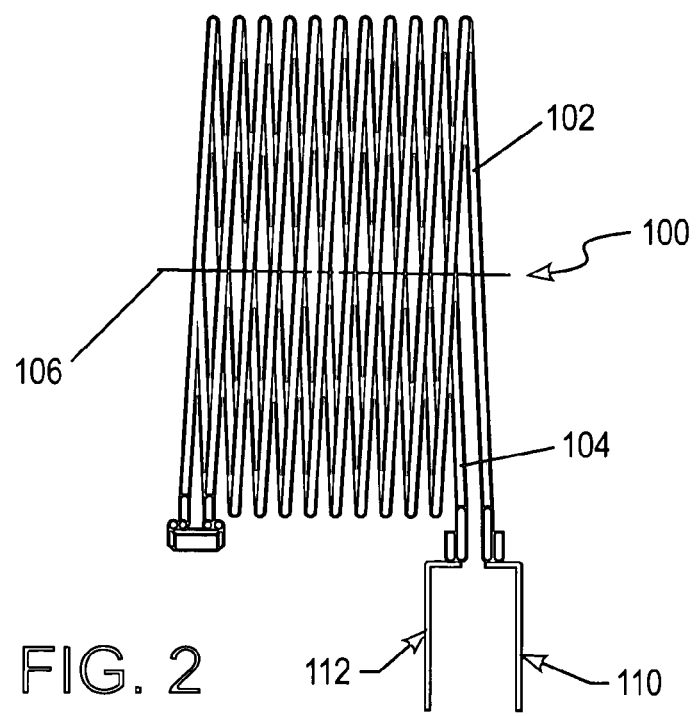
FIG. 2 shows the assembly of FIG. 1 in a side view.

FIG. 2 shows the same assembly 100 of FIG. 1 from a side view.

A method to reduce a magnetic field in a heating element is disclosed. In an exemplary embodiment of a bifilar coil, the bifilar coil is electrically connected to place a direction of current flow in a first section of the coil and a second section of the coil in opposition, the first section and the second section sequentially adjacent in an axial direction of the bifilar coil.

Another disclosed method forms a heating element. For example, an exemplary method comprises constructing a bifilar helical coil by intertwining two helical components, each helical component formed from heating element wire. The two helical components are spatially positioned and electrically arranged, relative to each other, so that an electrical current applied to the bifilar helical coil travels through the two helical components in opposite directions simultaneously. The bifilar helical coil has a turn pitch of about twice an original turn pitch of one of the two helical components.

A further disclosed method forms a heating furnace. For example, an exemplary method comprises constructing a bifilar helical coil by intertwining two helical components, each helical component formed from heating element wire, and attaching the bifilar helical coil to an electrical circuit of a heating furnace. The two helical components are spatially positioned and electrically arranged so that electrical current simultaneously travels through the two helical components in opposite directions.

Figure 3:
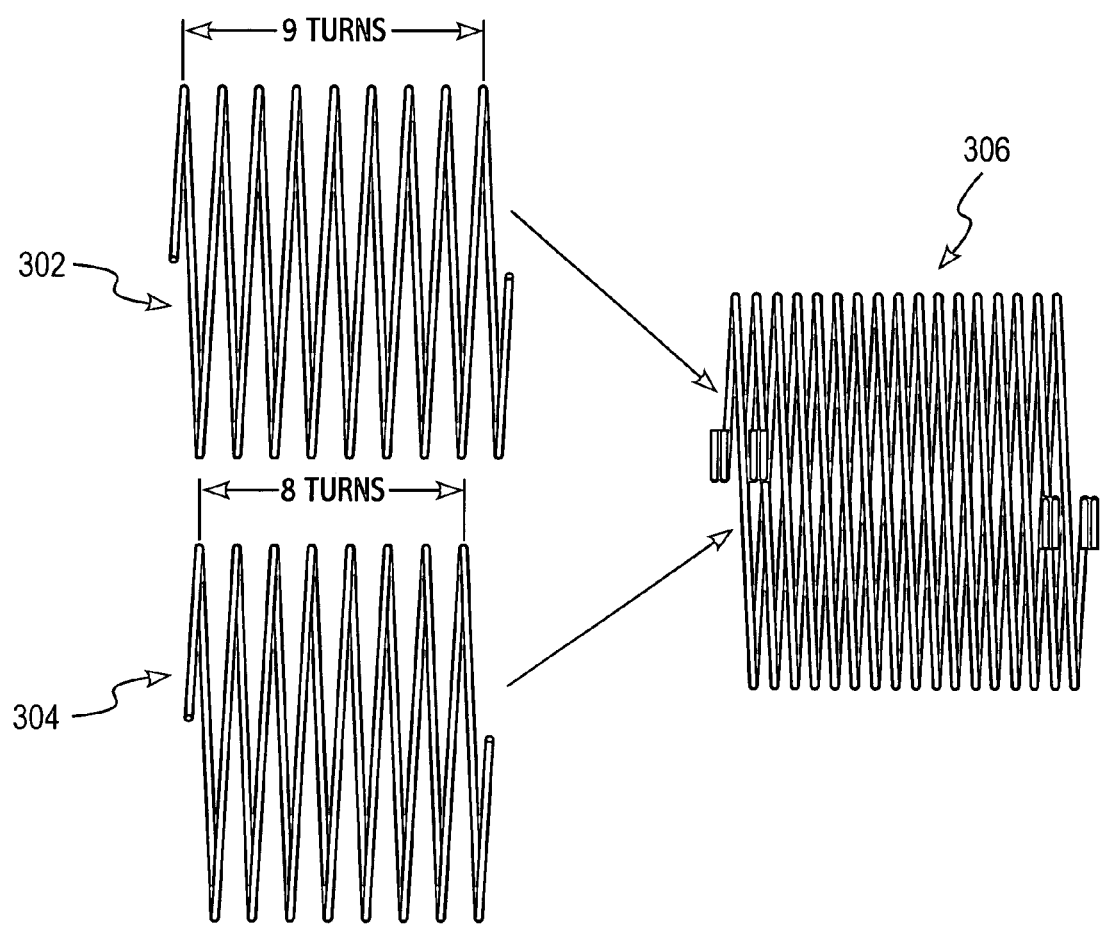
FIG. 3 shows two unifilar helical sections combined into a single bifilar section.

FIG. 3 shows an exemplary embodiment of a method to form a heating element. In the FIG. 3 exemplary method, two unifilar helical sections 302, 304 are combined into a single bifilar section 306. In the example shown, the first unifilar helical section 302 has 9 turns and the second unifilar helical section 304 has 8 turns, but any number of turns for the two unifilar helical sections 302, 304 can be used.

Construction methods can include separating a conventional coil of heating element wire into two equal helical components with a turn pitch of about 2× (about twice) the original helical coil. The two components are then intertwined by screwing them together to form a bifilar helical coil. These two coils are spatially positioned along the same axis so that the coils are not touching each other, but are electrically connected, either by a connector at an end or through an electrical circuit, so that the electrical current simultaneously travels through the two components in opposite directions and greatly reduces the magnetic field.

The drawings or exemplary embodiments show the construction of a heating element assembly with an internal jumper so that there are only 2 leads per zone. However, alternative constructions can be used, including, for example, multiple zones mechanically or electrically linked together to form a multi-zone heating element or two halves simultaneously manufactured in a pre-fabricated bifilar mode.

Heating element assemblies disclosed herein and constructed according to methods disclosed herein show improved performance. This can be seen with reference to FIGS. 4 and 5, discussed in more detail below.

Figure 4:
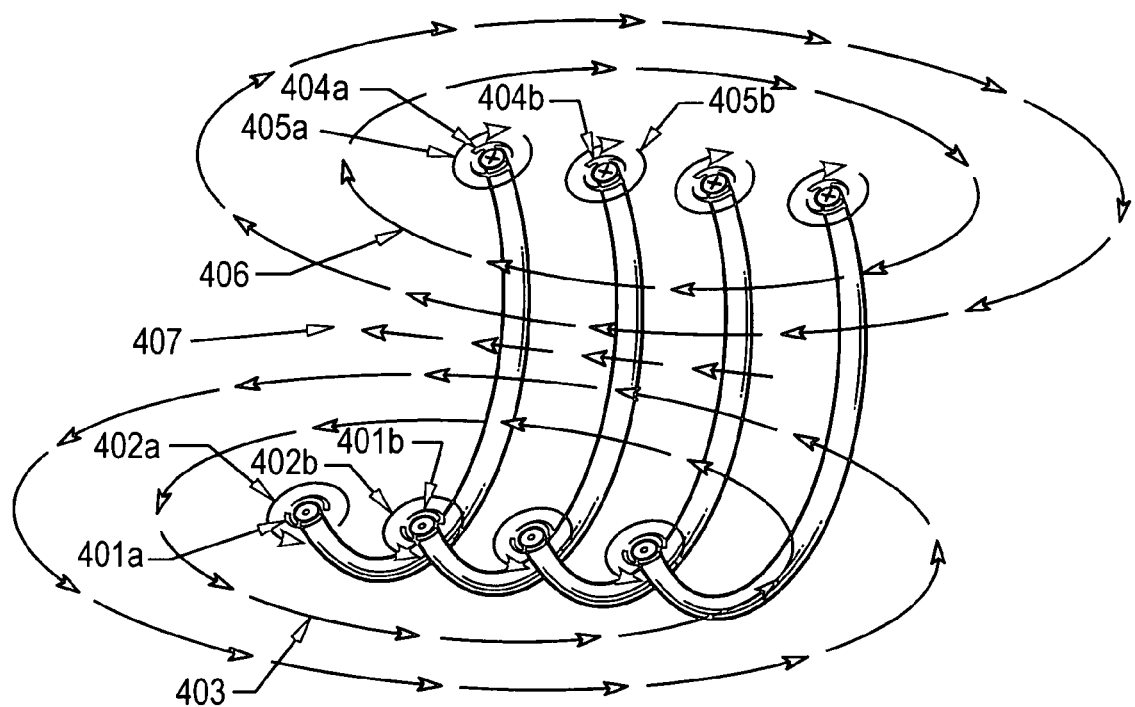
FIG. 4 is a schematic illustration of a cross-section of the magnetic fields generated by a conventional prior art coil.

FIG. 4 depicts a cross-section of the magnetic fields generated by a conventional prior art coil. In this example, the current is traveling in a direction that is toward the observer in coil segment 401a and 401b. This produces a magnetic field 402a and 402b in these segments with a counterclockwise (CCW) path. The fields produced by the adjacent segments combine to form a contiguous larger field 403 with the same CCW path. At the points on the coil approximately 180 degrees opposite locations 404a and 404b, the current is traveling away from the observer and produces individual fields 405a and 405b with a clockwise (CW) path. The fields on this side of the coil combine and produce larger contiguous field 406 with a CW path. Since the larger fields 403 and 406 have the same polarity through the axis of the coil, they produce a strong, contiguous magnetic field within the coil having a contiguous field vector 407.

Figure 5:
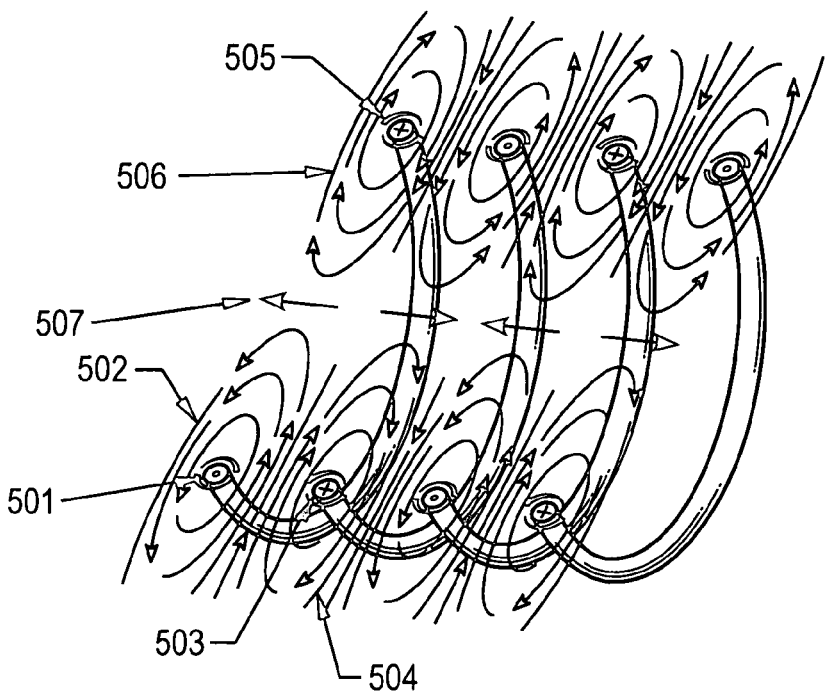
FIG. 5 is a schematic illustration of a cross-section of the magnetic fields generated by an exemplary embodiment of a heating element assembly as disclosed herein

FIG. 5 depicts a cross-section of the magnetic fields generated by an exemplary embodiment of a heating element assembly as disclosed herein. In this example, the current is traveling in a direction that is toward the observer in coil segment 501. This produces a magnetic field 502 in this segment with a CCW path. At the same time in the adjacent segment 503 the current is flowing in the opposite direction, away from the observer. This produces a field 504 that has a CW path in the adjacent segment. Since the adjacent fields 502 and 504 have opposite (CCW and CW) polarities, they do not combine to form a contiguous larger field, but instead remain as isolated weaker fields. At the point on the coil approximately 180 degrees opposite 506 from the reference point 501, the current is traveling away from the observer and produces a field 506 with a CW path. The pattern of opposing fields is repeated up this side of the coil with each coil segment having a field with the opposite polarity of the segments adjacent to it. The resultant magnetic field vector inside the coil 507 in this case is weak and non-contiguous Example and Tests: Laboratory tests were performed on a single zone element with a 254 mm inner diameter (ID), 330 mm long section constructed from two unifilar helical sections of ten turns of 8.25 mm outer diameter (OD) wire each. This assembly had an insulated outer diameter of approximately 381 mm. This coil had a current of approximately 212 amps peak (150 RMS) applied to it during testing. The lab test was done with a unit that had the two halves independently connected (e.g., with 4 leads) so that they could be externally wired to be in concurrence or opposition mode. In laboratory tests, an internal field strength of 90 gauss was measured with the coils connected in concurrence, while an internal field strength of 2 gauss was measured with the coil sections connected in opposition.

The assembly exhibited a reduction in magnetic field as follows:

Measure outside the element assembly at a distance of approximately 50 mm from the 381 mm OD shell (110 mm from the centerline of the wire) exhibited a reduction from a measured field of 8.93 gauss (for concurrence mode) to 2.73 gauss (for opposition mode). This parameter matches the calculation of 2.726 gauss shown below. The individual fields are weak and separate—therefore the field is consistent with the field generated by an individual conductor. The 8.93 gauss measurement is indicative of the combined effect of other coil segments having the same field polarity.

The internal field showed a reduction from about 90 gauss (for concurrence mode) to less than 2.0 gauss (for opposition mode). This parameter corresponds to the calculated value of 113.498 gauss shown below. Note that the calculation is for a solenoid coil and heating element configuration and therefore is only approximate the actual test sample. However, the less than 2 gauss field measured with the bifilar opposition mode configuration is approximately in line with the field calculated from the equations below using the distance of 135 mm (to the center of the coil).

The concurrence measurements are in line with the calculated values based on a standard solenoid. The following calculations apply to the above examples of measured fields:

Magnetic Field surrounding wire (≈equal to external field):

$\mu_0 = 4 \cdot \pi \cdot 10^{-7} \cdot T \cdot m \cdot A^{-1}$   Permeability of free space $I = \frac{212}{1.414} \cdot amp$   $I = 149.929$ A peak to RMS conductor current $r_d = 110 \cdot mm$   radial distance from conductor $B = \frac{(\mu_0 \cdot I)}{2 \cdot \pi \cdot r_d}$ $B = 2.726 \times 10^{-4} T$   $B = 2.726$ gauss Magnetic force between conductors:

$\mu_0 = 4 \cdot \pi \cdot 10^{-7} \cdot T \cdot m \cdot A^{-1}$   Permeability of free space $w_p = 16.6\,mm$   wire pitch $w_d = 8.25\,mm$   wire diameter $r_c = 127\,mm + w_d$   Coil radius ($ID/2$ + wire diameter)

$I = \frac{212}{1.414} \cdot amp$   $I = 149.929$ A peak to RMS conductor current $N = \frac{1}{w_p}$   $n = 60.241 \cdot \frac{1}{m}$ $B = \mu_0 \cdot n \cdot I$ $B = 0.011 T$   $B = 113.498$ gauss Although the present invention has been described in connection with preferred embodiments thereof, it will be appreciated by those skilled in the art that additions, deletions, modifications, and substitutions not specifically described may be made without department from the spirit and scope of the invention as defined in the appended claims.

What is claimed is:

1. A method of forming a heating furnace, the method comprising:
   forming a heating element assembly by constructing a bifilar helical coil by intertwining two helical components, each helical component formed from heating element wire; and
   attaching the bifilar helical coil to an electrical circuit of a heating furnace,
   wherein the two helical components are spatially positioned and electrically arranged, relative to each other so that electrical current applied to the bifilar helical coil simultaneously travels through the two helical components in opposite directions.

2. The method of claim 1, wherein the bifilar helical coil has a turn pitch of about twice an original turn pitch of one of the two helical components.

3. A heating furnace, comprising:
   a heating element assembly, comprising two components, each component formed from heating element wire,
   wherein the two components are spatially dispersed over the same axis and positioned relative to each other so that an electrical current applied to the heating element is independently controlled in each of the two components.

4. The heating furnace of claim 3, wherein the two components are two helical components and the heating element is a bifilar helical coil.

5. The heating furnace of claim 4, wherein the two helical components are intertwined.

6. The heating furnace of claim 3, wherein the two components have a non-helical shape.

7. The heating furnace of claim 3, wherein a first of the two components is electrically joined to a second of the two components.

8. The heating furnace of claim 3, wherein a first of the two components is electrically isolated from a second of the two components.

9. The heating furnace of claim 3, wherein the two components are wired to be in concurrence.

10. The heating furnace of claim 3, wherein the two components are wired to be in opposition.

11. The heating furnace of claim 9, wherein a generated magnetic field is increased.

12. The heating furnace of claim 10, wherein a generated magnetic field is decreased.

13. The heating furnace of claim 3, wherein the configuration of the two components controls a generated magnetic field of the heating furnace.

14. A method of forming a heating furnace, the method comprising:

forming a heating element assembly by constructing a bifilar helical coil by intertwining two helical components, each helical component formed from heating element wire; and attaching the bifilar helical coil to an electrical circuit of a heating furnace, wherein the two helical components are spatially positioned and electrically arranged, relative to each other so that electrical current applied to the bifilar helical coil simultaneously travels through the two helical components in the same direction.

15. The method of claim 14, wherein the bifilar helical coil has a turn pitch of about twice an original turn pitch of one of the two helical components.

* * * * *